United States Patent
Chung et al.

(10) Patent No.: US 11,744,096 B2
(45) Date of Patent: *Aug. 29, 2023

(54) LIGHT EMITTING DEVICE AND DISPLAY DEVICE INCLUDING 1HE SAME

(71) Applicant: SAMSUNG ELECTRONICS CO., LTD, Suwon-si (KR)

(72) Inventors: Dae Young Chung, Suwon-si (KR); Kwanghee Kim, Seoul (KR); Eun Joo Jang, Suwon-si (KR); Tae Hyung Kim, Seoul (KR); Hongkyu Seo, Anyang-si (KR); Heejae Lee, Seoul (KR); Jaejun Chang, Gwacheon-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/671,970

(22) Filed: Feb. 15, 2022

(65) Prior Publication Data

US 2022/0173342 A1 Jun. 2, 2022

Related U.S. Application Data

(63) Continuation of application No. 16/851,276, filed on Apr. 17, 2020, now Pat. No. 11,251,390.

(30) Foreign Application Priority Data

Apr. 19, 2019 (KR) .................. 10-2019-0046358

(51) Int. Cl.
*H01L 51/50* (2006.01)
*H10K 50/115* (2023.01)
(Continued)

(52) U.S. Cl.
CPC .......... *H10K 50/115* (2023.02); *H10K 50/13* (2023.02); *H10K 71/00* (2023.02); *H10K 71/15* (2023.02);
(Continued)

(58) Field of Classification Search
CPC ........................ H01L 51/502; H01L 51/504
See application file for complete search history.

(56) References Cited

U.S. PATENT DOCUMENTS

| 7,910,400 B2 | 3/2011 | Kwon et al. |
| 8,330,142 B2 | 12/2012 | Cho et al. |

(Continued)

FOREIGN PATENT DOCUMENTS

| JP | 2016061833 A | 4/2016 |
| KR | 100754396 B1 | 8/2007 |

(Continued)

*Primary Examiner* — Anthony Ho
(74) *Attorney, Agent, or Firm* — Cantor Colburn LLP

(57) ABSTRACT

A light emitting device including a first electrode and a second electrode, and an emission layer disposed between the first electrode and the second electrode and including quantum dots, a first charge auxiliary layer disposed between the emission layer and the first electrode, and a second charge auxiliary layer disposed between the emission layer and the second electrode, wherein the emission layer comprises a first emission layer contacting the first charge auxiliary layer, a second emission layer disposed on the first emission layer, and a third emission layer disposed on the second emission layer. The hole mobility of the first emission layer decreases sequentially from the first emission layer to the third emission layer.

24 Claims, 3 Drawing Sheets

(51) Int. Cl.
    *H10K 50/13*     (2023.01)
    *H10K 71/00*     (2023.01)
    *H10K 71/15*     (2023.01)
    *H10K 71/40*     (2023.01)
    *H10K 101/30*     (2023.01)
    *H10K 102/00*     (2023.01)

(52) U.S. Cl.
    CPC ....... *H10K 71/441* (2023.02); *H10K 2101/30* (2023.02); *H10K 2102/351* (2023.02)

(56) References Cited

U.S. PATENT DOCUMENTS

| | | |
|---|---|---|
| 9,753,198 B2 | 9/2017 | Saitoh et al. |
| 9,905,790 B2 | 2/2018 | Koh et al. |
| 11,251,390 B2 * | 2/2022 | Chung .................. H01L 51/56 |
| 2017/0352827 A1 | 12/2017 | Cho et al. |

FOREIGN PATENT DOCUMENTS

| | | |
|---|---|---|
| KR | 101140309 B1 | 4/2012 |
| KR | 101652789 B1 | 8/2016 |
| KR | 1020160093429 A | 8/2016 |
| KR | 1020170048965 A | 5/2017 |
| KR | 101794082 B1 | 10/2017 |

* cited by examiner

LIGHT EMITTING DEVICE AND DISPLAY DEVICE INCLUDING THE SAME

CROSS-REFERENCE TO RELATED APPLICATION

This is a continuation application of U.S. application Ser. No. 16/851,276, filed Apr. 17, 2020, which has issued U.S. Pat. No. 11,251,390, which in turn claims priority to Korean Patent Application No. 10-2019-0046358 filed in the Korean Intellectual Property Office on Apr. 19, 2019, and all the benefits accruing therefrom under 35 U.S.C. §§ 119,120, the contents of which in their entirety are herein incorporated by reference.

BACKGROUND

1. Field

A light emitting device and a display device including the light emitting device are disclosed.

2. Description of the Related Art

Quantum dots are a nanocrystal semiconductor material having a diameter of less than or equal to around 10 nanometers (nm), and which exhibit quantum confinement effects. In most instances, quantum dots generate stronger (more intense) light in a narrow wavelength region than commonly used phosphors. Quantum dots emit light from excited electrons as the latter transition from a conduction band to a valence band, and the light emitted wavelength depends upon average particle size even of the same material. As quantum dots may emit light of a shorter wavelength with smaller average particle size, the quantum dots may provide light in a desirable wavelength region by adjusting the average particle size of the quantum dots.

In other words, an emission layer including quantum dots and various types of electronic devices including the quantum dots may generally save production costs, compared with an organic light emitting diode using an emission layer including a phosphorescent and/or fluorescent material, and desirable colors may be emitted by adjusting the average particle size of quantum dots in the absence of other light emitting organic materials in the emission layer.

Luminous efficiency of the emission layer including quantum dots is determined by the quantum efficiency of quantum dots, a balance of charge carriers, light extraction efficiency, and the like. Particularly, in order to improve the quantum efficiency, excitons may be confined in the emission layer, and in some instances, if the excitons are not confined in the emission layer for a variety of factors, the non-confinement may cause a problem such as exciton quenching.

SUMMARY

An embodiment provides a light emitting device capable of realizing improved efficiency and life-span characteristics.

Another embodiment provides a display device including the light emitting device.

According to an embodiment, a light emitting device includes a first electrode and a second electrode, and an emission layer disposed between the first electrode and the second electrode and including quantum dots, a first charge auxiliary layer disposed between the emission layer and the first electrode, and a second charge auxiliary layer disposed between the emission layer and the second electrode, wherein the emission layer includes a first emission layer contacting the first charge auxiliary layer, a second emission layer disposed on the first emission layer, and a third emission layer disposed on the second emission layer, and a hole mobility of the emission layer decreases sequentially from the first emission layer to the third emission layer.

The quantum dots of the emission layer may include an organic ligand on the surface and a content of the organic ligand of the quantum dots of the first emission layer may be less than a content of the organic ligand of the quantum dots of the third emission layer.

A content of the organic ligand of the quantum dots of the first emission layer may be less than or equal to about 70 parts by weight, for example less than or equal to about 60 parts by weight based on 100 parts by weight of the organic ligand of the quantum dots of the third emission layer.

A content of the organic ligand may sequentially increase from the first emission layer to the third emission layer.

The quantum dots included in the first emission layer may include a ligand and may include an organic ligand in an amount of less than or equal to about 10 wt % based on a total weight, 100 wt % of the quantum dots including the ligand.

The organic ligand may include RCOOH, $RNH_2$, $R_2NH$, $R_3N$, RSH, $R_3PO$, $R_3P$, ROH, RCOOR, $RPO(OH)_2$, RHPOOH, RHPOOH, or a combination thereof, wherein R is independently a C3 to C40 substituted or unsubstituted aliphatic hydrocarbon group, a C6 to C40 substituted or unsubstituted aromatic hydrocarbon group, or a combination thereof.

The quantum dots of the emission layer may further include a halogen as a ligand and a content of the halogen of the quantum dots of the first emission layer may be greater than a content of the halogen of the quantum dots of the third emission layer.

The halogen content of the quantum dots of the emission layer may decrease sequentially from the first emission layer to the third emission layer.

The quantum dots of the first emission layer may further include a halogen as a ligand, and the second emission layer and the third emission layer may not include a halogen.

The quantum dots of the first emission layer may further include a halogen as a ligand and may include a halogen ligand in an amount of less than or equal to about 50 weight percent (wt %) based on 100 wt % of the organic ligand and the halogen ligand of the quantum dots of the first emission layer.

The halogen may include fluorine, chlorine, bromine, iodine, or a combination thereof.

The first emission layer, second emission layer, and third emission layer may be configured to emit light of the same color or a different color.

The second charge auxiliary layer may include a nanoparticle including a metal oxide.

The metal oxide may be a zinc metal oxide represented by Chemical Formula 1:

$$Zn_{1-x}M_xO \quad \text{Chemical Formula 1}$$

In Chemical Formula 1,

M is Mg, Ca, Zr, W, Li, Ti, Y, Al, or a combination thereof, and $0 \le x \le 0.5$.

The respective thickness of the first emission layer, the second emission layer, and the third emission layer may be the same or different and may be about 1 nanometer (nm) to about 100 nm.

A HOMO energy level of the first charge auxiliary layer adjacent to the first emission layer may be equal to or less than a HOMO energy level of the first emission layer though within about 1.0 electron volts (eV) or less.

A HOMO energy level of the second emission layer adjacent to the first emission layer may be equal to or less than a HOMO energy level of the first emission layer though within about 1.0 eV or less.

A difference between HOMO energy levels of two respective adjacent layers of the first emission layer, the second emission layer, or the third emission layer in the emission layer may be in the range of about 0 eV to about 1.0 eV.

In another embodiment, a method of producing the aforementioned light emitting device includes forming an emission layer on the first electrode; forming a first charge auxiliary layer on the emission layer; and forming a second electrode on the first charge auxiliary layer, wherein the forming of the emission layer includes forming a first quantum dot coating film including a plurality of quantum dots having organic ligand present on the surface and removing at least a portion of the organic ligand from the surface of the quantum dots of the first coating film to form a first emission layer;

forming a second quantum dot coating film on the first emission layer, the second dot coating film including a plurality of quantum dots having organic ligand present on the surface and removing at least a portion of organic ligand from the surface of the quantum dots of the second quantum dot coating film to form a second emission layer, wherein a content of the organic ligand of the second emission layer is greater than a content of the organic ligands of the first emission layer; and forming a third quantum dot coating film on the second emission layer, the third quantum dot coating film including a plurality of quantum dots having organic ligand present on the surface to form a third emission layer.

The first emission layer and the second emission layer may be produced by a method including preparing an alcohol solution of a metal halide;

contacting each of the first quantum dot coating film and the second quantum dot coating film with the alcohol solution; and removing the alcohol solution from the first quantum dot coating film and the second quantum dot coating film, and drying the first quantum dot coating film and the second quantum dot coating film.

The metal halide may include zinc halide.

The metal halide may include a fluoride, a chloride, a bromide, an iodide, or a combination thereof.

A content of the organic ligand of the first emission layer may be less than or equal to about 70 parts by weight, for example about 60 parts or 50 parts by weight based on 100 parts by weight of the organic ligands of the third emission layer.

Another embodiment provides a display device including the aforementioned light emitting device.

The light emitting device may have improved efficiency and life-span simultaneously.

DETAILED DESCRIPTION

Figure 1:
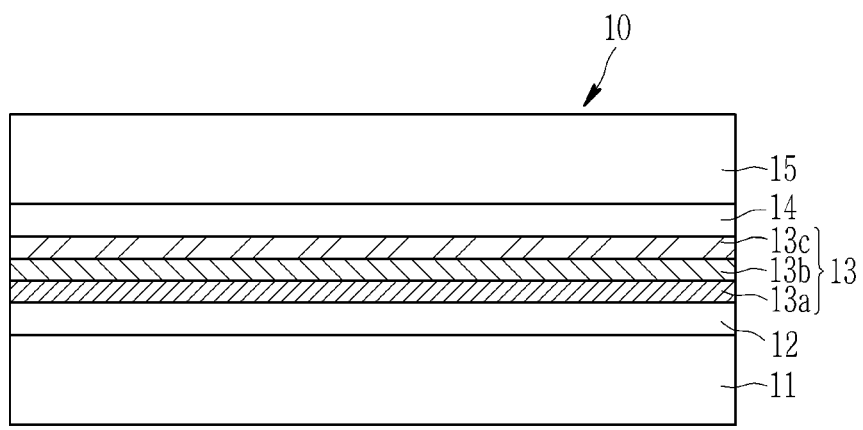
FIG. 1 is a schematic cross-sectional view of a light emitting device according to an embodiment.

Hereinafter, example embodiments of the present disclosure will be described in detail so that a person skilled in the art would understand the same. This disclosure may, however, be embodied in many different forms and is not construed as limited to the example embodiments set forth herein. Rather, these embodiments are provided so that this disclosure will be thorough and complete, and will fully convey the scope of the invention to those skilled in the art.

In the drawings, the thickness of layers, films, panels, regions, etc., are exaggerated for clarity. Like reference numerals designate like elements throughout the specification. It will be understood that when an element such as a layer, film, region, or substrate is referred to as being "on" another element, it can be directly on the other element or intervening elements may also be present. In contrast, when an element is referred to as being "directly on" another element, there are no intervening elements present.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

The terminology used herein is for the purpose of describing particular embodiments only and is not intended to be limiting. As used herein, the singular forms "a," "an," and "the" are intended to include the plural forms, including "at least one," unless the content clearly indicates otherwise. "At least one" is not to be construed as limiting "a" or "an." "or" means "and/or." As used herein, the term "and/or" includes any and all combinations of one or more of the associated listed items. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within 10% or 5% of the stated value.

Unless otherwise defined, all terms (including technical and scientific terms) used herein have the same meaning as commonly understood by one of ordinary skill in the art to which this disclosure belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, "sequentially" refers to a change in a content percentage of a compound, ligand, or group, or a change in a particular property or characteristic, of a material or layer, along a coordinate direction of the material or the layer. In an ordered structure of multiple layers the term "sequentially" also refers to a change in content of the compound, ligand, or group, or the particular characteristic or property, from one adjacent layer to the next layer. The change in content percentage, or change in character or property, may be step-wise, linear and continuous, non-linear and continuous, or a combination thereof.

A work function or a HOMO energy level is expressed as an absolute value from a vacuum level. In addition, when the work function or the HOMO energy level is referred to be "deep," "high" or "large," the work function or the HOMO energy level has a large absolute value based on "0 eV" of the vacuum level, while when the work function or the HOMO energy level is referred to be "shallow," "low," or "small," the work function or HOMO energy level has a small absolute value based on "0 eV" of the vacuum level.

As used herein, "Group" refers to a group of the Periodic Table.

As used herein, "Group II" refers to Group IIA and Group IIB, and examples of Group II metal may be Cd, Zn, Hg, and Mg, but are not limited thereto.

As used herein, "Group III" refers to Group IIIA and Group IIIB, and examples of Group III metal may be Al, In, Ga, and Tl, but are not limited thereto.

As used herein, "Group IV" refers to Group IVA and Group IVB, and examples of a Group IV metal may be Si, Ge, and Sn, but are not limited thereto. As used herein, the term "metal" may include a semi-metal such as Si.

As used herein, "Group I" refers to Group IA and Group IB, and examples may include Li, Na, K, Rb, and Cs, but are not limited thereto.

As used herein, "Group V" refers to Group VA, and examples may include nitrogen, phosphorus, arsenic, antimony, and bismuth, but are not limited thereto.

As used herein, "Group VI" refers to Group VIA, and examples may include sulfur, selenium, and tellurium, but are not limited thereto.

As used herein, when a definition is not otherwise provided, "substituted" refers to replacement of hydrogen of a compound, a group, or a moiety by a substituent selected from a C1 to C30 alkyl group, a C2 to C30 alkenyl group, a C2 to C30 alkynyl group, a C2 to C30 epoxy group, a C2 to C30 alkenyl group, a C2 to C30 alkylester group, a C3 to C30 alkenylester group (e.g., acrylate group, methacrylate group, etc.), a C6 to C30 aryl group, a C7 to C30 alkylaryl group, a C1 to C30 alkoxy group, a 01 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR' wherein R and R' are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a 01 to C6 alkyl group or a C6 to C12 aryl group), a carboxyl group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), and a combination thereof.

Herein, "hydrocarbon group" refers to a group including carbon and hydrogen (e.g., alkyl, alkenyl, alkynyl, or aryl group). The hydrocarbon group may be a group having a monovalence or greater formed by removal of one or more hydrogen atoms from, alkane, alkene, alkyne, or arene. In the hydrocarbon group, at least one methylene may be replaced by an oxide moiety, a carbonyl moiety, an ester moiety, —NH—, or a combination thereof.

Herein, "alkyl" refers to a linear or branched saturated monovalent hydrocarbon group (methyl, ethyl hexyl, etc.).

Herein, "alkenyl" may refer to a linear or branched monovalent hydrocarbon group having one or more carbon-carbon double bond.

Herein, "alkynyl" refers to a linear or branched monovalent hydrocarbon group having one or more carbon-carbon triple bond.

Herein, "aryl" refers to a group formed by removal of at least one hydrogen from an aromatic group (e.g., phenyl or naphthyl group).

Herein, "hetero" refers to one including 1 to 3 heteroatoms of N, O, S, Si, P, or a combination thereof.

FIG. 1 is a schematic cross-sectional view of a light emitting device according to an embodiment.

Referring to FIG. 1, a light emitting device 10 according to an embodiment includes a first electrode 11 and a second electrode 15 facing each other, an emission layer 13 disposed between the first electrode 11 and the second electrode 15 and including quantum dots, a first charge auxiliary layer 12 disposed between the emission layer 13 and the first electrode 11, and a second charge auxiliary layer 14 disposed between the emission layer 13 and the second electrode 15.

One of the first electrode 11 and the second electrode 15 may be an anode and the other may be a cathode. For example, the first electrode 11 may be an anode and the second electrode 15 may be a cathode.

The first electrode 11 may be made of a conductor, for example a metal, a conductive metal oxide, or a combination thereof. The first electrode 11 may be for example made of a metal such as nickel, platinum, vanadium, chromium, copper, zinc, and gold or an alloy thereof; a conductive metal oxide such as zinc oxide, indium oxide, tin oxide, indium tin oxide (ITO), indium zinc oxide (IZO), or fluorine doped tin oxide; or a combination of a metal and an oxide such as ZnO and Al or $SnO_2$ and Sb, but is not limited thereto. In an embodiment, the first electrode may include a transparent conductive metal oxide, for example, indium tin oxide. A work function of the first electrode may be higher than a work function of the second electrode that will be described later. A work function of the first electrode may be lower than a work function of the second electrode that will be described later.

The second electrode 15 may be made of a conductor, for example a metal, a conductive metal oxide, and/or a conductive polymer. The second electrode 15 may be for example made of a metal such as aluminum, magnesium, calcium, sodium, potassium, titanium, indium, yttrium, lithium, gadolinium silver, gold, platinum, tin, lead, cesium, or barium, or an alloy thereof; a conductive metal oxide such as zinc oxide, indium oxide, tin oxide, indium tin oxide (ITO), indium zinc oxide (IZO), or fluorine doped tin oxide; a multi-layered structure material such as LiF/Al, $LiO_2$/Al, Liq/Al, LiF/Ca, and $BaF_2$/Ca, but is not limited thereto.

In an embodiment, the work function of the first electrode 11 may be for example about 4.5 electron volts (eV) to about 5.0 eV (e.g., about 4.6 eV to about 4.9 eV) and the work function of the second electrode 15 may be for example greater than or equal to about 4.0 eV and less than about 4.5 eV (e.g., about 4.0 eV to about 4.3 eV). A work function of the first electrode may be higher than a work function of the second electrode. In another embodiment, the work function of the second electrode 15 may be for example about 4.5 eV to about 5.0 eV (e.g., about 4.6 eV to about 4.9 eV) and the work function of the first electrode 11 may be for example greater than or equal to about 4.0 eV and less than about 4.5 eV (e.g., about 4.0 eV to about 4.3 eV). A work function of the first electrode may be lower than a work function of the second electrode. At least one of the first electrode 11 and the second electrode 15 may be a light-transmitting electrode, and the light-transmitting electrode may be for example made of a conductive oxide such as zinc oxide, indium oxide, tin oxide, indium tin oxide (ITO), indium zinc oxide (IZO), or fluorine doped tin oxide, or a metal thin layer of a single layer or a multilayer. When one of the first electrode 11 and the second electrode 15 is a non-light-transmitting electrode, it may be made of for example an opaque conductor such as aluminum (Al), silver (Ag), or gold (Au).

The thickness of the first electrode and the second electrode are not particularly limited and may be appropriately selected considering device efficiency. For example, the thickness of the first electrode and the second electrode may be greater than or equal to about 5 nm, for example, greater than or equal to about 50 nm. For example, the thickness of the first electrode and the second electrode may be less than or equal to about 100 micrometers (µm), for example, less than or equal to about 10 µm, less than or equal to about 1 µm, less than or equal to about 900 nm, less than or equal to about 500 nm, or less than or equal to about 100 nm.

The emission layer 13 includes a first emission layer 13a contacting the first charge auxiliary layer 12, a second emission layer 13b disposed on the first emission layer 13a, and a third emission layer 13c disposed on the second emission layer 13b, wherein a hole mobility decreases sequentially from the first emission layer 13a to the third emission layer 13c.

The quantum dots of the emission layer 13 may include an organic ligand present on a surface thereof and a content of the organic ligand of quantum dots of the first emission layer 13a may be less than a content of the organic ligand of quantum dots of the third emission layer 13c. In an embodiment, the content of the organic ligand of the quantum dots of the first emission layer 13a may be less than or equal to about 70 parts by weight, for example less than or equal to about 65 parts by weight, less than or equal to about 60 parts by weight, less than or equal to about 55 parts by weight, or less than or equal to about 50 parts by weight based on 100 parts by weight of the organic ligand of the quantum dots of the third emission layer 13c. In an embodiment, the content of the organic ligand of the quantum dots of the first emission layer 13a may be greater than or equal to about 0 part by weight, for example about 1 part by weight, greater than or equal to about 2 parts by weight, greater than or equal to about 3 parts by weight, greater than or equal to about 4 parts by weight, greater than or equal to about 5 parts by weight, greater than or equal to about 6 parts by weight, greater than or equal to about 7 parts by weight, greater than or equal to about 8 parts by weight, greater than or equal to about 9 parts by weight, greater than or equal to about 10 parts by weight, or greater than or equal to about 12 parts by weight based on 100 parts by weight of the organic ligand of the quantum dots of the third emission layer 13c.

In addition, the content of the organic ligand of the quantum dots of the second emission layer 13b may be greater than the content of the organic ligand of the quantum dots of the first emission layer 13a and less than the content of the organic ligand of the quantum dots of the third emission layer 13c. In an embodiment, the content of the organic ligand of the quantum dots of the second emission layer 13b may be greater than or equal to about 15 parts by weight, for example greater than or equal to about 20 parts by weight, greater than or equal to about 25 parts by weight, greater than or equal to about 30 parts by weight, greater than or equal to about 35 parts by weight, or greater than or equal to about 40 parts by weight based on 100 parts by weight of the organic ligand of the quantum dots of the third emission layer 13c and may be less than or equal to about 95 parts by weight, for example less than or equal to about 90 parts by weight, less than or equal to about 80 parts by weight, less than or equal to about 75 parts by weight, less than or equal to about 70 parts by weight, less than or equal to about 65 parts by weight, or less than or equal to about 60 parts by weight based on 100 parts by weight of the organic ligand of the quantum dots of the third emission layer 13c.

The content of the organic ligand may be sequentially increased from the first emission layer 13a to the third emission layer 13c. In each of the emission layers 13a, 13b, and 13c, assuming that a weight of the quantum dots is 100 wt %, the content of organic ligand may be about 15 wt % when measured by thermogravimetric analysis (TGA). A difference between the contents of the organic ligands in each of adjacent layers of the emission layers 13a, 13b, and 13c may be about 0.1 wt % to about 3 wt %, for example about 0.2 wt % to about 2.5 wt %.

The emission layer 13 may include (e.g., a plurality of) quantum dot(s). The quantum dots are nano-sized semiconductor nanocrystal particles and may exhibit quantum confinement effects. The quantum dots may include a Group II-VI compound, a Group III-V compound, a Group IV-VI compound, a Group IV element or compound, a Group compound, a Group compound, a Group I-II-IV-VI compound, or a combination thereof.

The Group II-VI compound may be selected from a binary element compound selected from CdSe, CdTe, ZnS, ZnSe, ZnTe, ZnO, HgS, HgSe, HgTe, MgSe, MgS, and a mixture thereof; a ternary element compound selected from CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, MgZnS, and a mixture thereof; and a quaternary element compound selected from HgZnTeS, CdZnSeS, CdZnSeTe, CdZnSTe, CdHgSeS, CdHgSeTe, CdHgSTe, HgZnSeS, HgZnSeTe, HgZnSTe, and a mixture thereof. The Group II-VI compound may further include a Group III metal. The Group III-V compound may be selected from a binary element compound selected from GaN, GaP, GaAs, GaSb, AlN, AlP, AlAs, AlSb, InN, InP, InAs, InSb, and a mixture thereof; a ternary element compound selected from GaNP, GaNAs, GaNSb, GaPAs, GaPSb, AlNP, AlNAs, AlNSb, AlPAs, AlPSb, InNP, InNAs, InNSb, InPAs, InPSb, and a mixture thereof; and a quaternary element compound selected from GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, InAlPSb, InZnP, and a mixture thereof. The Group III-V compound may further include a Group II metal (e.g., InZnP). The Group IV-VI compound may be selected from a binary element compound selected from SnS, SnSe, SnTe, PbS, PbSe, PbTe, and a mixture thereof; a ternary element compound selected from SnSeS, SnSeTe, SnSTe, PbSeS, PbSeTe, PbSTe, SnPbS, SnPbSe, SnPbTe, and a mixture thereof; and a quaternary element compound selected from SnPbSSe, SnPbSeTe, SnPbSTe, and a mixture thereof. Examples of the Group compound may include CuInSe$_2$, CuInS$_2$, CuInGaSe, and CuInGaS, but are not limited thereto. Examples of the Group I-II-IV-VI compound may include CuZnSnSe and CuZnSnS, but are not limited thereto. The Group IV element or compound may be selected from a single element selected from Si, Ge, and a mixture thereof; and a binary element compound selected from SiC, SiGe, and a mixture thereof.

In an embodiment, the quantum dots may not include a heavy metal (e.g., cadmium, lead, mercury, or both of them). As used herein, "not including a heavy metal" refers to including the heavy metal substantially, for example, in an amount of less than about 100 parts per million (ppm), less than about 50 ppm, less than about 30 ppm, or less than about 20 ppm. The quantum dots may include, for example, semiconductor nanocrystals including a Group III-V compound including indium and phosphorus. The Group III-V compound may further include zinc. The quantum dot may include a semiconductor nanocrystal including a Group II-VI compound including a chalcogen element (e.g., sulfur, selenium, tellurium, or a combination thereof) and zinc.

In the quantum dots, the aforementioned binary element compound, ternary element compound, and/or quaternary element compound respectively exists in a uniform concentration in the particle or in partially different concentrations in the same particle. The semiconductor nanocrystals may have a core/shell structure wherein a first semiconductor nanocrystal (core) surrounds another second semiconductor nanocrystal (shell) having the same or different composition. In an embodiment, the quantum dots may include a core including the aforementioned compounds (i.e., Group II-VI compound, Group III-V compound, Group IV-VI compound, Group IV element or compound, Group compound, Group I-II-IV-VI compound, or a combination thereof) and a shell having a different composition from the core and including the aforementioned compounds.

The core may include InP, InZnP, ZnSe, ZnSeTe, or a combination thereof. The shell may include InP, InZnP, ZnSe, ZnS, ZnSeTe, ZnSeS, or a combination thereof. The shell may include a multi-layered shell having at least two layers. The shell may include Zn, Se, and optionally S (e.g., directly) on the core. The shell may include zinc and sulfur in the outermost layer.

The core and the shell may have a concentration gradient wherein the concentration of the element(s) of the shell decreases toward the core. In addition, the semiconductor nanocrystals may have a structure including one semiconductor nanocrystal core and multi-shells surrounding the core. Herein, the multi-layered shell structure has a structure of two or more shells and each layer may have a single composition or an alloy or may have a concentration gradient.

In the quantum dots, the shell material and the core material may have different energy bandgaps from each other. For example, the energy bandgap of the shell material may be greater than that of the core material. According to another embodiment, the energy bandgap of the shell material may be less than that of the core material. The quantum dot may have a multi-layered shell. In the multi-layered shell, the energy bandgap of the outer layer may be greater than the energy bandgap of the inner layer (i.e., the layer nearer to the core). In the multi-layered shell, the energy bandgap of the outer layer may be less than the energy bandgap of the inner layer.

In an embodiment, the quantum dots may include a core including a first semiconductor nanocrystal including indium, phosphorus, and optionally zinc and a shell disposed on the core and including a second semiconductor nanocrystal including zinc and a chalcogen element. In another embodiment, the quantum dots may include a core including a first semiconductor nanocrystal including zinc, selenium, and optionally tellurium and a shell disposed on the core and including a second semiconductor nanocrystal including zinc and a chalcogen element.

The quantum dots may have an average particle size of greater than or equal to about 1 nm and less than or equal to about 100 nm. The quantum dots may have an average particle size of about 1 nm to about 20 nm, for example, greater than or equal to about 2 nm, greater than or equal to about 3 nm, or greater than or equal to about 4 nm and less than or equal to about 50 nm, less than or equal to about 40 nm, less than or equal to about 30 nm, less than or equal to about 20 nm, less than or equal to about 15 nm, less than or equal to about 10 nm, less than or equal to about 9 nm, or less than or equal to about 8 nm. Shapes of the quantum dots are not particularly limited. For example, the shapes of the quantum dots may be a sphere, a polyhedron, a pyramid, a multipod, a square, a rectangular parallelepiped, a nanotube, a nanorod, a nanowire, a nanosheet, or a combination thereof, but is not limited thereto.

The aforementioned quantum dots may be commercially available or appropriately synthesized.

In the light emitting device according to an embodiment, the quantum dots may include an organic ligand present on the surface. The organic ligand may have a hydrophobic moiety. The organic ligand may be bound to the surfaces of the quantum dots. The organic ligand may be RCOOH, RNH$_2$, R$_2$NH, R$_3$N, RSH, R$_3$PO, R$_3$P, ROH, RCOOR, RPO(OH)$_2$, RHPOOH, RHPOOH, or a combination thereof, wherein R is independently a C3 (C5) to C40 substituted or unsubstituted aliphatic hydrocarbon group such as a substituted or unsubstituted C3 to C40 alkyl or alkenyl, a C6 to C40 substituted or unsubstituted aromatic hydrocarbon group such as a substituted or unsubstituted C6 to C40 aryl group, or a combination thereof.

Examples of the organic ligand may be a thiol compound such as methane thiol, ethane thiol, propane thiol, butane thiol, pentane thiol, hexane thiol, octane thiol, dodecane thiol, hexadecane thiol, octadecane thiol, or benzyl thiol; amine such as methane amine, ethane amine, propane amine, butane amine, pantyl amine, hexyl amine, octyl amine, nonyl amine, decyl amine, dodecyl amine, hexadecyl amine, octadecyl amine, dimethyl amine, diethyl amine, dipropyl amine, tributyl amine, or trioctyl amine; a carboxylic acid compound such as methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; a phosphine compound such as methyl phosphine, ethyl phosphine, propyl phosphine, butyl phosphine, pentyl phosphine, octyl phosphine, dioctyl phosphine, tributyl phosphine, or trioctyl phosphine; a phosphine compound or an oxide compound thereof such as methyl phosphine oxide, ethyl phosphine oxide, propyl phosphine oxide, butyl phosphine oxide pentyl phosphine oxide, tributyl phosphine oxide, octyl phosphine oxide, dioctyl phosphine oxide, or trioctyl phosphine oxide; a diphenyl phosphine, a triphenyl phosphine compound, or an oxide compound thereof; C5 to C20 alkyl phosphonic acid such as hexyl phosphinic acid, octyl phosphinic acid, dodecane phosphinic acid, tetradecane phosphinic acid, hexadecane phosphinic acid, octadecane phosphinic acid; and the like, but are not limited thereto. The quantum dots may include hydrophobic organic ligands alone or in a mixture of at least one type. The hydrophobic organic ligand may not include a photopolymerizable moiety (e.g., acrylate group, methacrylate group, etc.).

The first emission layer 13a, the second emission layer 13b, and the third emission layer 13c may include the same type of organic ligand. In an embodiment, the first emission layer 13a, the second emission layer 13b, and the third emission layer 13c may include an organic ligand having a carboxylic acid group. In another embodiment, the first emission layer 13a may include an organic ligand having a carboxylic acid moiety, and the third emission layer 13c may include an organic ligand having a carboxylic acid moiety, an organic ligand having a thiol group, or a combination thereof. The first emission layer 13a may not include an organic ligand having a thiol group.

Each respective thickness of the first emission layer 13a, the second emission layer 13b, and the third emission layer 13c may be the same or different, and may be greater than or equal to about 1 nm, for example, greater than or equal to about 2 nm, greater than or equal to about 3 nm, greater than or equal to about 4 nm, greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, greater than or equal to about 20 nm, greater than or equal to about 25 nm, or greater than or equal to about 30 nm. In addition, each respective thickness of the first emission layer 13a, the second emission layer 13b, and the third emission layer 13c may be less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 20 nm. In an embodiment, each respective thickness of the first emission layer 13a, the second emission layer 13b, and the third emission layer 13c may be 1 monolayer or more (e.g., 2 monolayers) consisting of quantum dots, but is not limited thereto.

The emission layer 13 may have a thickness of greater than or equal to about 5 nm, for example, greater than or equal to about 10 nm, greater than or equal to about 20 nm, or greater than or equal to about 30 nm and less than or equal to about 200 nm, for example, less than or equal to about 150 nm, less than or equal to about 100 nm, less than or equal to about 90 nm, less than or equal to about 80 nm, less than or equal to about 70 nm, less than or equal to about 60 nm, or less than or equal to about 50 nm. The emission layer 13 may have a thickness of about 10 nm to about 150 nm, for example about 10 nm to about 100 nm, or about 10 nm to about 50 nm.

The quantum dots may possess high color reproducibility and may have particular applicability as a next-generation display material in terms of forming an emission layer in a solution process. Colloid synthesized quantum dots may include organic ligands (e.g., organic compounds including long-chain aliphatic hydrocarbon and a functional group, such as oleic acid (OA)) on the surfaces. Such an organic ligand is necessary to ensure dispersibility of the quantum dots in mediums, but it may interfere with charge flows in the quantum dots formed as a monolayer. Accordingly, it may be difficult to balance the electrons/holes in the electroluminescent device including the quantum dot emission layer. For example, when a flow of positive charges (holes) relative to negative charges (electrons) is limited in the quantum dot emission layer 13, a light emitting region may be produced not inside the emission layer but on an interface between a hole auxiliary layer (e.g., hole transport layer) and the emission layer, and excitons produced on the interface may be easily quenched, which may have a negative influence on device efficiency. Particularly, extra electrons not recombined on the interface due to high LUMO energy of quantum dot (QD) in QD-LED emitting blue light may move toward the hole transport layer, and accordingly, the device efficiency may exhibit a decrease in device stability, e.g., the device may exhibit severe deterioration in terms of lifetime.

However, a light emitting device according to an embodiment has the emission layer 13 having the aforementioned structure and thus may show enhancement or improvement in life-span characteristics as well as improved electroluminescence properties. Without being bound by any particular theory, the aforementioned structure of the light emitting device according to an embodiment may have an enlarged light emitting region and may induce the light emitting region produced through an electron-hole recombination to be formed near or proximate to the center of the emission layer, and accordingly, the device may exhibit improved properties.

A content change of the organic ligands may have a direct influence on hole (or charge) transport capability of the emission layer 13, and accordingly, when contents of the organic ligands in the emission layer 13 is adjusted as described above, the electron-hole recombination may be formed near or proximate to the center in the second emission layer 13b. For example, the first emission layer 13a including a relatively small amount of the organic ligands (e.g., oleic acid) may exhibit relatively greater hole mobility.

Accordingly, when the first emission layer 13a including quantum dots having a decreased amount of the organic ligands is in contact with the first charge auxiliary layer (hole auxiliary layer) 12 and the third emission layer 13c including quantum dots having a relatively large amount of the organic ligands (e.g., oleic acid) is in contact with the second charge auxiliary layer (electron auxiliary layer) 14, the device may exhibit improved electroluminescence properties. In other words, by changing content of the organic ligand in a thickness direction, the first emission layer 13a including quantum dots having a strong hole mobility may be disposed near to the first charge auxiliary layer (hole transport layer) 12 and the third emission layer 13c including quantum dots having a weak hole mobility (i.e., relatively strong electron mobility) may be disposed near to the second charge auxiliary layer (an electron transport layer, 14). In a light emitting device according to an embodiment, a content of the organic ligand may be changed in a thickness direction through a manufacturing method described later, and thus a light emitting region of the second emission layer 13b may contribute more to light emission, and improved electroluminescence properties (efficiency and luminance) and extended life-span may be exhibited.

Herein, a difference between the contents of the organic ligands of the emission layer 13 may be for example confirmed by scanning or transmission electron microscope energy dispersive X-ray spectroscopy (e.g., SEM-EDX), and the like, but is not limited thereto.

The emission layer 13 may further include a halogen as a ligand and a content of the halogen of the quantum dots of the first emission layer 13a may be higher than that of the halogen of the quantum dots of the third emission layer 13c.

The quantum dots of the first emission layer 13a may further include a halogen as a ligand and the quantum dots of the second emission layer 13b and the quantum dots of the third emission layer 13c may not include a halogen.

The quantum dots of the first emission layer 13a may further include a halogen as a ligand and the halogen ligand may be included in an amount of less than or equal to about 50 wt %, less than or equal to about 49 wt %, less than or equal to about 48 wt %, less than or equal to about 47 wt %, less than or equal to about 46 wt %, less than or equal to about 45 wt %, less than or equal to about 44 wt %, less than or equal to about 43 wt %, less than or equal to about 42 wt %, less than or equal to about 41 wt %, less than or equal to about 40 wt %, less than or equal to about 39 wt %, less than or equal to about 38 wt %, less than or equal to about 37 wt %, less than or equal to about 36 wt %, less than or equal to about 35 wt %, less than or equal to about 34 wt %, less than or equal to about 33 wt %, less than or equal to about 32 wt %, less than or equal to about 31 wt %, less than or equal to about 30 wt %, less than or equal to about 28 wt %, or less than or equal to about 25 wt % based on a total amount, 100 wt % of the organic ligand and the halogen ligand of the first emission layer. In an embodiment, the quantum dots of the first emission layer 13a may further include a halogen as a ligand and the halogen ligand may be included in an amount of greater than or equal to about 10 wt %, greater than or equal to about 12 wt %, or greater than or equal to about 15 wt % based on a total amount, 100 wt % of the organic ligand and the halogen ligand of the first emission layer.

The halogen may include fluorine, chlorine, bromine, iodine, or a combination thereof. A presence of the halogen may be confirmed by X-ray photoelectron spectroscopy (XPS), but is not limited thereto. In an embodiment, the XPS of the emission layer 13 may confirm the presence of a bond of $ZnCl_2$. A content of the halogen (e.g., confirmed by XPS or SEM-EDX) of the emission layer 13 may be greater than or equal to about 0.0001, for example, greater than or equal to about 0.0005, greater than or equal to about 0.001, greater than or equal to about 0.002, greater than or equal to about 0.003, greater than or equal to about 0.004, greater than or equal to about 0.005, greater than or equal to about 0.006, greater than or equal to about 0.007, greater than or equal to about 0.008, greater than or equal to about 0.009, or greater than or equal to about 0.01, relative to Zn. A content of the halogen (e.g., confirmed by XPS or SEM-EDX) in the emission layer 13 may be less than or equal to about 0.9, for example, less than or equal to about 0.8, less than or equal to about 0.7, less than or equal to about 0.6, less than or equal to about 0.5, less than or equal to about 0.4, less than or equal to about 0.3, less than or equal to about 0.2, less than or equal to about 0.1, less than or equal to about 0.09, less than or equal to about 0.08, less than or equal to about 0.07, less than or equal to about 0.06, less than or equal to about 0.05, less than or equal to about 0.04, or less than or equal to about 0.03, relative to zinc (Zn).

In the emission layer 13, the quantum dots may control an absorption/emission wavelength by adjusting a composition and average particle size of the quantum dot. A maximum peak emission wavelength of the quantum dot may be an ultraviolet (UV) to infrared wavelength or a wavelength of greater than the above wavelength range. For example, the maximum peak emission wavelength of the quantum dot may be greater than or equal to about 300 nm, for example, greater than or equal to about 500 nm, greater than or equal to about 510 nm, greater than or equal to about 520 nm, greater than or equal to about 530 nm, greater than or equal to about 540 nm, greater than or equal to about 550 nm, greater than or equal to about 560 nm, greater than or equal to about 570 nm, greater than or equal to about 580 nm, greater than or equal to about 590 nm, greater than or equal to about 600 nm, or greater than or equal to about 610 nm. The maximum peak emission wavelength of the quantum dot may be less than or equal to about 800 nm, for example, less than or equal to about 650 nm, less than or equal to about 640 nm, less than or equal to about 630 nm, less than or equal to about 620 nm, less than or equal to about 610 nm, less than or equal to about 600 nm, less than or equal to about 590 nm, less than or equal to about 580 nm, less than or equal to about 570 nm, less than or equal to about 560 nm, less than or equal to about 550 nm, or less than or equal to about 540 nm. The maximum peak emission wavelength of the quantum dots may be in the range of about 500 nm to about 650 nm. The maximum peak emission wavelength of the quantum dots may be in the range of about 500 nm to about 550 nm (green). The maximum peak emission wavelength of the quantum dots may be in the range of about 600 nm to about 650 nm (red).

The first emission layer 13a, the second emission layer 13b, and the third emission layer 13c may be configured to emit light of the same color. Herein, each quantum dots included in the first emission layer 13a, the second emission layer 13b, and the third emission layer 13c may have a difference of central wavelength of less than or equal to about 15 nm at maximum, for example, less than or equal to about 10 nm. In this case, light (e.g., electroluminescence peak) emitted from the first emission layer 13a, the second emission layer 13b, and the third emission layer 13c may independently have a full width at half maximum (FWHM) of less than or equal to about 60 nm, less than or equal to about 50 nm, less than or equal to about 40 nm, less than or equal to about 35 nm, less than or equal to about 30 nm, less than or equal to about 25 nm, or less than or equal to about 20 nm.

Alternatively, in the emission layer 13, the first emission layer 13a, the second emission layer 13b, and the third emission layer 13c may be configured to emit light of different colors from each other.

The quantum dots may have (electroluminescence or photoluminescence) quantum efficiency of greater than or equal to about 10%, for example, greater than or equal to about 30%, greater than or equal to about 50%, greater than or equal to about 60%, greater than or equal to about 70%, greater than or equal to about 90%, or even about 100%. The quantum dots may have a relatively narrow emission spectrum. A (electro- or photo-) emission spectrum of the quantum dots may have for example a full width at half maximum (FWHM) of less than or equal to about 50 nm, for example less than or equal to about 45 nm, less than or equal to about 40 nm, less than or equal to about 35 nm, or less than or equal to about 30 nm.

The first emission layer 13a may not be dissolved by a C1 to 010 alcohol solvent (e.g., ethanol, methanol, propanol, isopropanol, butanol, pentenol, isopentenol, hexanol, heptanol, etc.), cyclohexyl acetate, acetone, toluene, cyclohexane, a C1 to 010 alkane series solvent (e.g., hexane), or a combination thereof.

The third emission layer 13c may not be dissolved by a C1 to 010 alcohol solvent.

The first emission layer 13a may not include arylamine. The third emission layer 13c may not include an organic compound having a heterocycle including oxygen, sulfur, nitrogen, or silicon.

The first emission layer 13a may include the organic ligand as a first organic ligand and may further include a second organic ligand that is different from the first organic ligand. The second organic ligand may include a C3 to C20 organic compound including a thiol group and an alcohol group. In another embodiment, the first emission layer 13a may not include a thiol organic ligand.

The third emission layer 13c may include the organic ligand as a first organic ligand and may further include a second organic ligand that is different from the first organic ligand. The second organic ligand may further include C3 to C40 alkane thiol. In another embodiment, the third emission layer 13c may not include a thiol organic ligand.

The second emission layer 13b, which is disposed between the first emission layer 13a and the third emission layer 13c, may have a hole mobility between the hole mobility of the first emission layer 13a and the hole mobility of the third emission layer 13c. The quantum dots included in the second emission layer 13b may further include a metal oxide (e.g., aluminum oxide, etc.) present on the surface.

The emission layer 13 may have a HOMO energy level of greater than or equal to about 5.4 eV, greater than or equal to about 5.6 eV, greater than or equal to about 5.7 eV, greater than or equal to about 5.8 eV, greater than or equal to about 5.9 eV, or greater than or equal to about 6.0 eV. The emission layer 13 may have a HOMO energy level of less than or equal to about 7.0 eV, less than or equal to about 6.8 eV, less than or equal to about 6.7 eV, less than or equal to about 6.5 eV, less than or equal to about 6.3 eV, or less than or equal to about 6.2 eV. In an embodiment, the emission layer 13 may have a HOMO energy level of about 5.5 eV to about 6.1 eV.

The emission layer 13 may have for example a LUMO energy level of less than or equal to about 3.8 eV, for example, less than or equal to about 3.7 eV, less than or equal to about 3.6 eV, less than or equal to about 3.5 eV, less than or equal to about 3.4 eV, less than or equal to about 3.3 eV, less than or equal to about 3.2 eV, or less than or equal to about 3.0 eV. The emission layer 13 may have a LUMO energy level of greater than or equal to about 2.5 eV, for example, greater than or equal to about 2.6 eV, greater than or equal to about 2.7 eV, or greater than or equal to about 2.8 eV. In an embodiment, the emission layer 13 may have an energy bandgap of about 2.4 eV to about 3.5 eV.

The first charge auxiliary layer 12 disposed between the emission layer 13 and the first electrode 11 may have one layer or two or more layers and may include, for example a hole injection layer, a hole transport layer, and/or an electron blocking layer.

The HOMO energy level of the first charge auxiliary layer (hole auxiliary layer) 12 may be adjusted to match the HOMO energy level of the emission layer 13, which may contribute to strengthening hole mobility from the hole auxiliary layer 12 into the emission layer 13.

The HOMO energy level of the first charge auxiliary layer (e.g., hole transport layer) 12 adjacent to the first emission layer 13a may be the same as the HOMO energy level of the emission layer 13 or less than the HOMO energy level of the emission layer 13 within about 1.0 eV or less. For example, a difference between the HOMO energy levels of the first charge auxiliary layer 12 and the first emission layer 13a may be about 0 eV to about 1.0 eV, for example greater than or equal to about 0.01 eV, greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

The HOMO energy level of the second emission layer 13b adjacent to the first emission layer 13a may be the same as the HOMO energy level of the first emission layer 13a or less than the HOMO energy level of the first emission layer 13a within about 1.0 eV or less. For example, a difference between the HOMO energy levels of the first emission layer 13a and the second emission layer 13b may be about 0 eV to about 1.0 eV, for example greater than or equal to about 0.01 eV, greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

In the emission layer 13, the HOMO energy levels of the first emission layer 13a, the second emission layer 13b, and the third emission layer 13c are in similar ranges, and a difference between two adjacent layers thereof may be about 0 eV to 1.0 eV, for example greater than or equal to about 0.01 eV, for example greater than or equal to about 0.1 eV and less than or equal to about 0.8 eV, less than or equal to about 0.7 eV, less than or equal to about 0.5 eV, less than or equal to about 0.4 eV, less than or equal to about 0.3 eV, less than or equal to about 0.2 eV, or less than or equal to about 0.1 eV.

The HOMO energy level of the first charge auxiliary layer 12 may be greater than or equal to about 5.0 eV, for example, greater than or equal to about 5.2 eV, greater than or equal to about 5.4 eV, greater than or equal to about 5.6 eV, or greater than or equal to about 5.8 eV. For example, the HOMO energy level of the first charge auxiliary layer 12 may be about 5.0 eV to about 7.0 eV, about 5.2 eV to about 6.8 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV, about 5.4 eV to about 6.1 eV, about 5.6 eV to about 7.0 eV, about 5.6 eV to about 6.8 eV, about 5.6 eV to about 6.7 eV, about 5.6 eV to about 6.5 eV, about 5.6 eV to about 6.3 eV, about 5.6 eV to about 6.2 eV, about 5.6 eV to about 6.1 eV, about 5.8 eV to about 7.0 eV, about 5.8 eV to about 6.8 eV, about 5.8 eV to about 6.7 eV, about 5.8 eV to about 6.5 eV, about 5.8 eV to about 6.3 eV, about 5.8 eV to about 6.2 eV, or about 5.8 eV to about 6.1 eV.

In an embodiment, the first charge auxiliary layer 12 may include a hole injection layer near to the first electrode 11 and a hole transport layer near to the first emission layer 13a. Herein, the HOMO energy level of the hole injection layer may be about 5.0 eV to about 6.0 eV, about 5.0 eV to about 5.5 eV, about 5.0 eV to about 5.4 eV and the HOMO energy level of the hole transport layer may be about 5.2 eV to about 7.0 eV, about 5.4 eV to about 6.8 eV, about 5.4 eV to about 6.7 eV, about 5.4 eV to about 6.5 eV, about 5.4 eV to about 6.3 eV, about 5.4 eV to about 6.2 eV or about 5.4 eV to about 6.1 eV.

A material included in the first charge auxiliary layer 12 (e.g., hole transport layer or hole injection layer) is not particularly limited and may include for example at least one selected from poly(9,9-dioctyl-fluorene-co-N-(4-butylphenyl)-diphenylamine) (TFB), polyarylamine, poly(N-vinylcarbazole), poly (3,4-ethylenedioxythiophene) (PEDOT), poly(3,4-ethylenedioxythiophene)polystyrene sulfonate (PEDOT:PSS), polyaniline, polypyrrole, N,N,N',N'-tetrakis (4-methoxyphenyl)-benzidine (TPD), 4-bis[N-(1-naphthyl)-N-phenyl-amino]biphenyl (α-NPD), m-MTDATA (4,4',4"-tris[phenyl(m-tolyl)amino]triphenylamine), 4,4',4"-tris(N-carbazolyl)-triphenylamine (TCTA), 1,1-bis[(di-4-tolyl amino)phenylcyclohexane (TAPC), dipyrazino[2,3-f:2',3'-h] quinoxaline-2,3,6,7,10,11-hexacarbonitrile (HAT-CN), a p-type metal oxide (e.g., NiO, $WO_3$, $MoO_3$, etc.), a carbon-based material such as graphene oxide, and a combination thereof, but is not limited thereto.

In the first charge auxiliary layer (hole auxiliary layer) 12, a thickness of each layer may be appropriately selected. For example, the thickness of each layer may be greater than or equal to about 10 nm, for example, greater than or equal to about 15 nm, or greater than or equal to about 20 nm and less than or equal to about 100 nm, for example, less than or equal to about 90 nm, less than or equal to about 80 nm, less than or equal to about 70 nm, less than or equal to about 60 nm, less than or equal to about 50 nm, less than or equal to about 40 nm, less than or equal to about 35 nm, or less than or equal to about 30 nm, but is not limited thereto.

The second charge auxiliary layer (electron auxiliary layer) 14 is disposed between the emission layer 13 and the second electrode (e.g., cathode) 15. The second charge auxiliary layer 14 may include, for example an electron injection layer, an electron transport layer, and/or a hole blocking layer, but is not limited thereto. In an embodiment, the second charge auxiliary layer 14 may include an electron transport layer.

The electron transport layer and/or the electron injection layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq_3$, $Inq_3$, $Znq_2$, $Zn(BTZ)_2$, $BeBq_2$, ET204 (84444,6-di(naphthalen-2-yl)-1,3,5-triazin-2-yl)phenyl)quinolone), 8-hydroxyquinolinato lithium (Liq), n-type metal oxide (e.g., ZnO, $HfO_2$, etc.), and a combination thereof, but is not limited thereto. The hole blocking layer may include for example at least one of 1,4,5,8-naphthalene-tetracarboxylic dianhydride (NTCDA), bathocuproine (BCP), tris[3-(3-pyridyl)-mesityl]borane (3TPYMB), LiF, $Alq_3$, $Gaq3$, $Inq3$, $Znq2$, $Zn(BTZ)_2$, $BeBq_2$, and a combination thereof, but is not limited thereto.

In an embodiment, the second charge auxiliary layer 14 (e.g., electron transport layer) includes a plurality of nanoparticles. The nanoparticles include a metal oxide including zinc.

The metal oxide may include $Zn_{1-x}M_xO$ (wherein M is Mg, Ca, Zr, W, Li, Ti, or a combination thereof and $0 \leq x \leq 0.5$). In an embodiment, in Chemical Formula 1, M may be magnesium (Mg). In an embodiment, in Chemical Formula 1, x may be greater than or equal to about 0.01 and less than or equal to about 0.3, for example, less than or equal to about 0.25, less than or equal to about 0.2, or less than or equal to about 0.15.

The metal oxide may include zinc oxide, zinc magnesium oxide, or a combination thereof. An absolute value of LUMO of the third emission layer 13c may be less than an absolute value of LUMO of the second charge auxiliary layer 14 (e.g., in case of a blue emission layer). In another embodiment, an absolute value of LUMO of the third emission layer 13c may be larger than an absolute value of LUMO of the second charge auxiliary layer 14 (e.g., in case of red or green emission layer).

An average size of the nanoparticles may be greater than or equal to about 1 nm, for example, greater than or equal to about 1.5 nm, greater than or equal to about 2 nm, greater than or equal to about 2.5 nm, or greater than or equal to about 3 nm and less than or equal to about 10 nm, less than or equal to about 9 nm, less than or equal to about 8 nm, less than or equal to about 7 nm, less than or equal to about 6 nm, or less than or equal to about 5 nm. The nanoparticles may not have a rod shape. The nanoparticles may not have a nano wire shape.

In an embodiment, each respective thickness of the second charge auxiliary layer 14 (e.g., an electron injection layer, an electron transport layer, or a hole blocking layer) may be greater than or equal to about 5 nm, greater than or equal to about 6 nm, greater than or equal to about 7 nm, greater than or equal to about 8 nm, greater than or equal to about 9 nm, greater than or equal to about 10 nm, greater than or equal to about 11 nm, greater than or equal to about 12 nm, greater than or equal to about 13 nm, greater than or equal to about 14 nm, greater than or equal to about 15 nm, greater than or equal to about 16 nm, greater than or equal to about 17 nm, greater than or equal to about 18 nm, greater than or equal to about 19 nm, or greater than or equal to about 20 nm and less than or equal to about 120 nm, less than or equal to about 110 nm, less than or equal to about 100 nm, less than or equal to about 90 nm, less than or equal to about 80 nm, less than or equal to about 70 nm, less than or equal to about 60 nm, less than or equal to about 50 nm, less than or equal to about 40 nm, less than or equal to about 30 nm, or less than or equal to about 25 nm, but is not limited thereto.

The light emitting device may further include a substrate (not shown). The substrate may be disposed at the side of the first electrode 11 or the second electrode 15. In an embodiment, the substrate may be disposed at the side of the first electrode. The substrate may be a substrate including an insulation material (e.g., an insulating transparent substrate). The substrate may include glass; various polymers such as polyester (e.g., polyethylene terephthalate (PET), polyethylene naphthalate (PEN)), polycarbonate, polyacrylate, polyimide, and polyamideimide, polysiloxane (e.g. PDMS); inorganic materials such as $Al_2O_3$ and ZnO; or a combination thereof, but is not limited thereto. The substrate may be made of a silicon wafer, and the like. Herein, "transparent"

refers to transmittance for light in a predetermined wavelength (e.g., light emitted from the quantum dots) of greater than or equal to about 85%, for example, greater than or equal to about 88%, greater than or equal to about 90%, greater than or equal to about 95%, greater than or equal to about 97%, or greater than or equal to about 99%. A thickness of the substrate may be appropriately selected considering a substrate material, and the like, but is not particularly limited. The transparent substrate may have flexibility. The substrate may be omitted.

Figure 2:
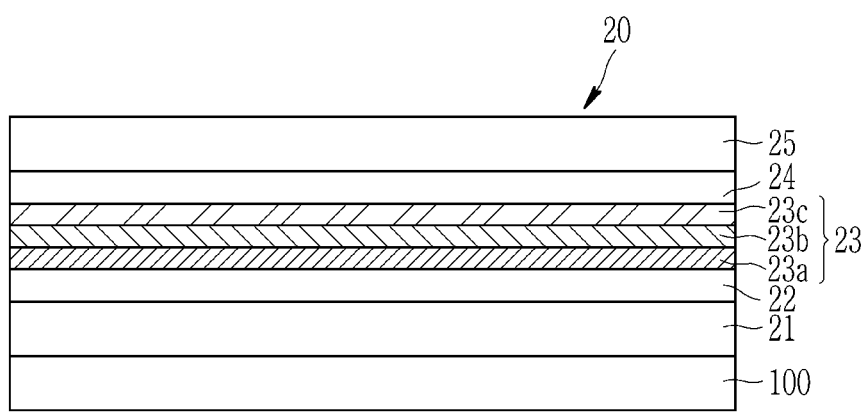
FIG. 2 is a schematic cross-sectional view of a light emitting device according to another embodiment.
Figure 3:
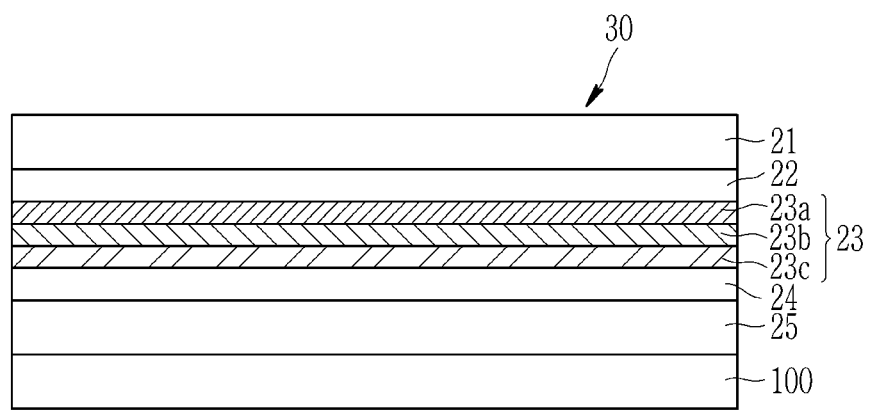
FIG. 3 is a schematic cross-sectional view of a light emitting device according to another embodiment.

The structure of a light emitting device including the substrate is described referring to FIGS. 2 and 3.

FIG. 2 is a cross-sectional view schematically showing a light emitting device according to an embodiment having a normal structure. Referring to FIG. 2, a light emitting device 20 includes a first electrode (anode, 21) disposed on a transparent substrate 100 which may include a metal oxide-based transparent electrode (e.g., ITO electrode) and a second electrode 25 facing the first electrode 21 which may include a conductive metal (e.g., Mg, Al, and/or Ag, etc.) (e.g., having a relatively low work function). A first charge auxiliary layer 22 (e.g., a hole injection layer of PEDOT:PSS and/or p-type metal oxide, and the like and/or hole transport layer of TFB and/or PVK) may be disposed between the first electrode 21 and the emission layer 23. The hole injection layer may be near to the first electrode 21 and the hole transport layer may be near to the emission layer 23. A second charge auxiliary layer (an electron auxiliary layer, 24) such as an electron injection layer/electron transport layer, and the like may be disposed between the emission layer 23 and the second electrode 25. Like the emission layer 13 of FIG. 1, the emission layer 23 may include a first emission layer 23a, a second emission layer 23b, and a third emission layer 23c, which correspond to the first emission layer 13a, the second emission layer 13b, and the third emission layer 13c, respectively.

FIG. 3 is a schematic cross-sectional view of a light emitting device according to an embodiment having an inverted structure. Referring to FIG. 3, a light emitting device 30 includes a second electrode 25 disposed on a transparent substrate 100 which may include a metal oxide-based transparent electrode (e.g., ITO) and a first electrode 21 facing the second electrode 25 which may include a metal (e.g., Au, Ag, Al, and/or Mg, etc.) (e.g., having a relatively high work function). For example, (optionally doped) n-type metal oxide (crystalline Zn metal oxide) may be disposed between the second electrode (transparent electrode, 25) and the emission layer 23 as a second charge auxiliary layer 24 (an electron auxiliary layer, for example, an electron transport layer). $MoO_3$ or other p-type metal oxides may be disposed between the first electrode (metal electrode, 21) and the emission layer 23 as a first charge auxiliary layer 22 (a hole auxiliary layer, for example, a hole transport layer including TFB and/or PVK, and/or a hole injection layer including PVK and/or $MoO_3$ or other p-type metal oxides). Like the emission layer 13 of FIG. 1, the emission layer 23 may include a first emission layer 23a, a second emission layer 23b, and a third emission layer 23c, which correspond to the first emission layer 13a, the second emission layer 13b, and the third emission layer 13c, respectively.

Another embodiment provides a method of producing the aforementioned light emitting device. The method includes forming an emission layer on the first electrode; forming a first charge auxiliary layer on the emission layer; and forming a second electrode on the first charge auxiliary layer, wherein, the forming of the emission layer includes forming a first quantum dot coating film including a plurality of quantum dots having organic ligand present on the surface and removing at least a portion of the organic ligand from the surface of the quantum dots of the first quantum dot coating film to form a first emission layer;

forming a second quantum dot coating film on the first emission layer, the second quantum dot coating film including a plurality of quantum dots having organic ligand present on the surface, and removing at least a portion of organic ligand present from the surface of the quantum dots of the second quantum dot coating film to form a second emission layer (wherein a content of the organic ligand of the quantum dots of the second emission layer is greater than a content of the organic ligand of the first emission layer); and forming a third quantum dot coating film on the second emission layer, the third quantum dot coating film including a plurality of quantum dots having organic ligand present on the surface to form a third emission layer.

The first electrode, the emission layer, the first charge auxiliary layer, the second charge auxiliary layer, and the second electrode are the same as described above.

The forming of the quantum dot coating film may be conducted by dispersing the quantum dots in a solvent (e.g., an organic solvent) to obtain quantum dot dispersion and applying or depositing it on the first charge auxiliary layer in an appropriate manner (e.g., spin coating, inkjet printing, etc.). The forming of the quantum dot coating film may further include heat-treating the applied or deposited quantum dot layer. The heat-treating temperature is not particularly limited, and may be appropriately selected considering a boiling point of the organic solvent. For example, the heat-treating temperature may be greater than or equal to about 60° C. The organic solvent of the quantum dot dispersion is not particularly limited and thus may be appropriately selected. In an embodiment, the organic solvent may include a (substituted or unsubstituted) aliphatic hydrocarbon organic solvent, a (substituted or unsubstituted) aromatic hydrocarbon organic solvent, an acetate solvent, or a combination thereof.

The first emission layer and the second emission layer may be produced by a method including preparing an alcohol solution of a metal halide;

contacting each of the first quantum dot coating film and the second quantum dot coating film with the alcohol solution; and removing the alcohol solution from the first quantum dot coating film and the second quantum dot coating film, and drying the first quantum dot coating film and the second quantum dot coating film.

The metal halide may include a Group 2B metal (e.g., zinc). The metal halide may include a fluoride, a chloride, a bromide, an iodide, or a combination thereof. In an embodiment, the metal halide may include a zinc chloride.

The preparing of the alcohol solution of the metal halide may include dissolving the aforementioned metal halide in an alcohol solvent (e.g., C1 to C10 alcohol, for example, methanol, ethanol, propanol, isopropanol, butanol, pentenol, hexanol, heptanol, etc.). A metal halide concentration in the alcohol solution may be greater than or equal to about 0.001 grams per Liter (g/L), for example, be greater than or equal to about 0.01 g/L, be greater than or equal to about 0.1 g/L, be greater than or equal to about 1 g/L, be greater than or equal to about 10 g/L, be greater than or equal to about 50 g/L, be greater than or equal to about 60 g/L, be greater than or equal to about 70 g/L, be greater than or equal to about 80 g/L, or be greater than or equal to about 90 g/L and less than or equal to about 1000 g/L, for example, less than or equal to about 500 g/L, less than or equal to about 400 g/L, less than or equal to about 300 g/L, less than or equal to about 200 g/L, less than or equal to about 100 g/L, less than or equal to about 90 g/L, less than or equal to about 80 g/L, less than or equal to about 70 g/L, less than or equal to about 60 g/L, less than or equal to about 50 g/L, less than or equal to about 40 g/L, less than or equal to about 30 g/L, less than or equal to about 20 g/L, or less than or equal to about 10 g/L, but is not limited thereto.

The contacting of the first quantum dot coating film and the second quantum dot coating film with the alcohol solution may include adding the alcohol solution to the first quantum dot coating film and the second quantum dot coating film in a dropwise fashion and/or spin coating following the dropwise addition. The adding in a dropwise fashion or spin coating after the dropwise addition may be performed at least once, for example, at least twice, at least three times, or at least four times.

The removing of the alcohol solution from the first quantum dot coating film, or the second quantum dot coating film, may include washing (e.g., adding alcohol solvent in a dropwise fashion and optionally spin coating) the first quantum dot coating film or the second quantum dot coating film. The washing may be performed at least once, for example, at least twice, or at least three times.

The drying of the first quantum dot coating film, or the second quantum dot coating film, from which the alcohol solution is removed may include heating the first quantum dot coating film or the second quantum dot coating film at a predetermined temperature. The heating temperature may be greater than or equal to about 30° C., greater than or equal to about 40° C., greater than or equal to about 50° C., greater than or equal to about 60° C., greater than or equal to about 70° C., greater than or equal to about 80° C., greater than or equal to about 90° C., or greater than or equal to about 100° C. The heating temperature may be less than or equal to about 200° C., less than or equal to about 190° C., less than or equal to about 180° C., less than or equal to about 170° C., less than or equal to about 160° C., less than or equal to about 150° C., less than or equal to about 140° C., less than or equal to about 130° C., less than or equal to about 120° C., less than or equal to about 110° C., less than or equal to about 100° C., or less than or equal to about 90° C.

The first emission layer and the second emission layer formed through a ligand removal treatment may exhibit a change in solubility, and therefore, a quantum dot dispersion may be applied or deposited on the first emission layer and the second emission layer formed through a ligand removal treatment, to form the third emission layer.

In general, it is not easy to form a thin film of quantum dots with multiple repeated coatings of a quantum dot dispersion that includes the same type of organic ligand because a solvent in the quantum dot dispersion may dissolve a previously coated quantum dot dispersion film. For example, multiple repeated coatings of a dispersion of quantum dots including the same type of organic ligand may not provide a quantum dot coating film having a desired or expected thickness.

In a method according to an embodiment, because dissolubility/dispersibility of quantum dots in the layer, which is subjected to the organic ligand removal treatment (e.g., halide exchange-treatment) is significantly changed, the quantum dot coating film which is subjected to organic ligand removal treatment (e.g., halide exchange-treatment) is not dissolved by the dispersion of quantum dots including the same type of organic ligand. In other words, because the polarity of the first emission layer and the second emission layer is significantly changed compared with the first quantum dot coating film and the second quantum dot coating film, there is no problem of dissolving the quantum dots, even if a quantum dot dispersion is used for the formation of the first emission layer and the second emission layer.

On the formed third emission layer, the second charge auxiliary layer (e.g., electron auxiliary layer) 14 and the second electrode (e.g., cathode) 15 may be formed. The second charge auxiliary layer (e.g., an electron auxiliary layer) 14 may be formed in an appropriate method by considering a material, a thickness, and the like of the charge auxiliary layer.

For example, since the formed third emission layer 13c may not be dissolved in an alcohol solvent, when an electron transport layer is formed based on the aforementioned zinc-containing metal oxide nanoparticles, nanoparticles dispersed in the alcohol solvent may be formed on the aforementioned third emission layer 13c.

Another embodiment provides an electronic device including the aforementioned light emitting device. The electronic device may be applied to various electronic devices such as display devices or lighting devices.

Hereinafter, the embodiments are illustrated in more detail with reference to examples. However, these examples are exemplary, and the present scope is not limited thereto.
Analysis Methods
[1] FT IR Analysis Infrared spectroscopy is performed by using Varian 670-IR.
[2] Electroluminescence Spectroscopy Electroluminescence properties of the obtained quantum dot light emitting device are evaluated using a Keithley 2200 source measuring device and a Minolta CS2000 spectroradiometer (current-voltage-luminance measurement equipment).
[3] Life-Span Characteristics T95 (h): With the light emitting device operating at 325 nits, a time in hours (hr) required for luminance to become 95% of the initial luminance of 100% is measured.
Quantum Dot Synthesis Synthesis Example 1-1: Production of Blue Light Emitting Quantum Dot (1) Selenium (Se) and tellurium (Te) are dispersed in trioctylphosphine (TOP) to obtain a Se/TOP stock solution and a Te/TOP stock solution. 0.125 millimoles (mmol) of zinc acetate is added along with oleic acid to a reactor including trioctylamine and vacuum-treated at 120° C. After 1 hour, an atmosphere in the reactor is converted to nitrogen.

The reactor is heated up to 300° C., the prepared Se/TOP stock solution and Te/TOP stock solution are rapidly injected into the reactor to provide a Te/Se ratio of 1/25. When the reaction is complete, the reaction solution is rapidly cooled to room temperature and acetone is added. A precipitate is obtained and isolated by centrifugation, which is then dispersed in toluene to obtain a ZnTeSe quantum dot dispersion in toluene.

(2) 1.8 mmoL (0.336 grams (g)) of zinc acetate is added along with oleic acid to a flask including trioctylamine. The flask is vacuum-treated at 120° C. for 10 minutes. The flask is substituted with nitrogen ($N_2$), and the temperature is increased to 180° C. The ZnTeSe core obtained in Synthesis Example 1 is added to a flask, and Se/TOP and S/TOP are injected into the flask. The reaction temperature is set to be about 280° C. After the reaction is complete, the reactor is cooled down, and the prepared nanocrystal is centrifuged, washed with ethanol, and dispersed in toluene to obtain a ZnTeSe/ZnSeS core/shell quantum dot dispersion in toluene.

Synthesis Example 1-2: Production of Red Light Emitting Quantum Dot (1) 0.2 mmol of indium acetate along with palmitic acid is dissolved in a 300 milliliters (mL) reaction flask including 1-octadecene and heated at 120° C. under vacuum. After 1 hour, a nitrogen atmosphere Is introduced into the reaction flask, which is then heated at 280° C. A tris(trimethylsilyl) phosphine (TMS3P)/trioctylphosphine mixed solution is rapidly injected into the reaction flask and reacted for 30 minutes. The reaction solution is rapidly cooled down to room temperature, acetone is added, and the resulting precipitate is obtained and separated by centrifugation are dispersed in toluene.

Se powder and S powder are respectively dissolved in TOP to prepare a Se/TOP stock solution and an S/TOP stock solution.

In a 300 mL reaction flask, zinc acetate and oleic acid are dissolved in trioctylamine and vacuum-treated at 120° C. for 10 minutes. Nitrogen is introduced into the flask, which is then to heated to 180° C. The prepared InP core is put in the flask, and a predetermined amount of the Se/TOP stock solution and a predetermined amount of the S/TOP are added to the flask, which is then heated to 280° C. and reacted for 60 minutes.

An excessive amount of ethanol is added to the reactants including the semiconductor nanocrystal and the solid precipitate separated by centrifugation. After the centrifugation, a supernatant is discarded, and precipitates therein are dried and dispersed in chloroform or toluene to obtain InP/ZnSeS core/shell quantum dot dispersion.

Synthesis of Metal Oxide Nanoparticles

Synthesis Example 2: Synthesis of Zn Metal Oxide Nanoparticles

Zinc acetate dihydrate and magnesium acetate tetrahydrate are added to dimethyl sulfoxide in a reactor so that a mole ratio of the chemical formula (indicated below) is provided, and the reactor is heated at 60° C. in air. Subsequently, an ethanol solution of tetramethyl ammonium hydroxide pentahydrate is added in a dropwise fashion to the reactor at a rate of 3 milliliters per minute (ml/min). The obtained mixture is stirred for one hour, and the $Zn_xMg_{1-x}O$ nanoparticles produced are isolated by centrifugation and dispersed in ethanol to obtain a dispersion of $Zn_xMg_{1-x}O$ nanoparticles (x=0.85).

The obtained nanoparticles are characterized by an X-ray diffraction analysis to confirm that ZnO crystals are formed. A transmission electron microscopic analysis of the obtained nanoparticles indicate that the particles have an average particle size of about 3 nm.

Energy bandgaps of the obtained nanoparticles are measured and monitored by a UV band edge tangent line (UV-2600, SHIMADZU). The results show that the synthesized $Zn_xMg_{1-x}O$ nanoparticle has an energy bandgap of about 3.52 eV to 3.70 eV.

Production of Blue Emission Layer Having Adjusted Content of Organic Ligand
Production of Blue Emission Layer 1-1
A blue emission layer 1-1 is formed by dispersing the core/shell quantum dots according to Synthesis Example 1-1 in cyclohexane to prepare a blue quantum dot dispersion, spin-coating the dispersion on a silicon substrate, and heat-treating it at 80° C. for 30 minutes.
Production of Blue Emission Layers 1-2 to 1-3
The blue emission layer 1-1 is five times washed with isopropyl alcohol, ethanol, and methanol, respectively to form blue emission layer 1-2 to 1-3.
Production of Blue Emission Layer 1-4
A blue emission layer 1-4 is formed by adding $ZnCl_2$ to dispersion prepared by dispersing the core/shell quantum dots according to Synthesis Example 1-1 in cyclohexane and stirring at 60° C. for 30 minutes to obtain quantum dots substituted with a Cl ligand and then, dispersing the obtained quantum dots in cyclohexane to prepare dispersion, spin-coating the dispersion on a silicon substrate, and heat-treating it at 80° C. for 30 minutes.
Production of Blue Emission Layer 1-5
A solution obtained by dissolving $ZnCl_2$ in ethanol (a concentration: 0.1 g/mL) is added in a dropwise fashion onto the blue emission layer 1-1, allowed to stand for 1 minute, partially removed by using a spin-coater, and five times washed with ethanol. Subsequently, drying is performed at an 80° C. hot plate for 20 minutes to form a blue emission layer 1-5.
Production of Blue Emission Layer 1-6
A solution obtained by dissolving $ZnCl_2$ in ethanol (a concentration: 0.1 g/mL) is added in a dropwise fashion onto the blue emission layer 1-4, allowed to stand for 1 minute, partially removed by using a spin coater, and five times washed with ethanol. Subsequently, drying is performed on an 80° C. hot plate for 20 minutes to form a blue emission layer 1-6.
Production of Red Emission Layer Having Adjusted Content of Organic Ligand
Production of Red Emission Layer 2-1
A red emission layer 2-1 is formed by dispersing the core/shell quantum dots according to Synthesis Example 1-2 in octane to obtain dispersion, spin-coating the dispersion on a silicon substrate, and heat-treating it at 80° C. for 30 minutes.
Production of Red Emission Layers 2-2 to 2-3
The obtained red emission layer 2-1 is five times washed with isopropyl alcohol, ethanol, and methanol respectively to form red emission layers 2-2 to 2-3.
Production of Red Emission Layer 2-4
A red emission layer 2-4 is formed on a silicon substrate by adding $ZnCl_2$ to dispersion obtained by dispersing the core/shell quantum dots according to Synthesis Example 1-2 in cyclohexane and stirring them at 60° C. for 30 minutes to obtain quantum dots substituted with a Cl ligand and then, dispersing the obtained quantum dots in octane, spin-coating the obtained dispersion, and heat-treating it at 80° C. for 30 minutes.
Production of Red Emission Layer 2-5
A solution obtained by dissolving $ZnCl_2$ in ethanol (a concentration: 0.1 g/mL) is added in a dropwise fashion onto the red emission layer 2-1, allowed to stand for 1 minute, partially removed by using a spin-coater, and five times washed with ethanol. Subsequently, drying is performed on an 80° C. hot plate for 20 minutes to form a blue emission layer 2-5.

Production of Red Emission Layer 2-6

A solution obtained by dissolving $ZnCl_2$ in ethanol (a concentration: 0.1 g/mL) is added in a dropwise fashion onto the red emission layer 2-4, allowed to stand for 1 minute, partially removed by using a spin-coater, and five times washed with ethanol. Subsequently, drying is performed on an 80° C. hot plate for 20 minutes to form a blue emission layer 2-6.

Infrared spectroscopy is performed with respect to the blue emission layers 1-1 to 1-6 and the red emission layers 2-1 to 2-6 to measure $COO^-$/Si peak intensity and calculate a percent decrease in content of the organic ligand (oleic acid, OA) from the surface of the quantum dot, and the results are shown in Table 1.

Infrared spectroscopy is performed with respect to the blue emission layers 1-1 to 1-3, 1-5 and the red emission layers 2-1 to 2-3 and 2-5 to measure $COO^-$/Si peak intensity and calculate a percent decrease in content of the organic ligand (oleic acid, OA) from the surface of the quantum dot, and the results are shown in Table 1.

TABLE 1

|  | $COO^-$/Si peak intensity | Organic ligand percent decrease relative to blue emission layer 1-1 |
| --- | --- | --- |
| Blue emission layer 1-1 | 1.13 |  |
| Blue emission layer 1-2 | 0.98 | 13.7% |
| Blue emission layer 1-3 | 0.91 | 19.8% |
| Blue emission layer 1-5 | 0.78 | 31.1% |

|  | $COO^-$/Si peak intensity | Organic ligand percent decrease relative to red emission layer 2-1 |
| --- | --- | --- |
| Red emission layer 2-1 | 1.50 |  |
| Red emission layer 2-2 | 1.26 | 15.7% |
| Red emission layer 2-3 | 1.25 | 16.4% |
| Red emission layer 2-5 | 0.85 | 43.2% |

Referring to Table 1, organic ligand of the blue emission layer 1-5, and the red emission layer 2-5, treated with the $ZnCl_2$ ethanol solution after the quantum dot coating exhibit a significant decrease in ligand content, and this result implies that chloride ion ($Cl^-$) instead of carboxylate ($COO^-$) is bound to the quantum dots of the quantum dot coating films.

Hole Mobility Evaluation of Emission Layer

Hole mobility of the blue emission layer 1-1 and the blue emission layer 1-5 is evaluated in the following two structures (below): HOD (Hole Only Device, ITO/PEDOT:PSS/TFB/QD emission layer (28 nm)/TCTA (36 nm)/HAT-CN (10 nm)/Ag) with each structure including the blue emission layer 1-1 and the blue emission layer 1-5, respectively, and hole mobility for each structure is evaluated.

HOD is produced in the following method. An ITO patterned substrate is surface-treated with ultraviolet (UV)-ozone (UVO). A PEDOT:PSS layer (lower hole injection layer (HIL)) is spin-coated to be about 30 nm thick and heat-treated to remove a residual organic material. A TFB layer (hole transport layer (HTL)) is spin-coated to be about 25 nm thick and heat-treated to remove a residual organic material. Quantum dot dispersion is spin-coated to form a 15 to 40 nm-thick emission layer and then, heat-treated to remove a residual organic material. A TCTA/HAT-CN (dipyrazino[2,3-f:2',3'-h]quinoxaline-2,3,6,7,10,11-hexacarbonitrile) layer as an upper hole transport layer (HTL) is sequentially thermally deposited to have a thickness of 36 nm/10 nm. Under a mask, silver (Ag) is thermally deposited to form an electrode. A sealing resin/glass is used to seal HOD.

Hole mobility is evaluated by measuring a current of HOD depending on a voltage with Keithley 2635B source meter, while the voltage is applied thereto.

The results are shown in Table 2.

TABLE 2

|  | Hole mobility ($mA/cm^2$, at 8 V) |
| --- | --- |
| Blue emission layer 1-1 | 0.12 |
| Blue emission layer 1-4 | 3.75 |
| Blue emission layer 1-5 | 25.89 |
| Blue emission layer 1-6 | 51.05 |

Referring to Table 2, the blue emission layers 1-1, 1-4, 1-5, and 1-6 exhibit different hole mobilities.

Production of Light Emitting Device

Example 1

A device having a stacked structure of ITO (155 nm)/PEDOT:PSS (30 nm)/TFB (25 nm)/first emission layer (20 nm)/second emission layer (20 nm)/third emission layer (20 nm)/$Zn_{0.85}Mg_{0.25}O$ (20 nm)/Al (100 nm) is produced as follows.

A 30 nm-thick hole injection layer (HIL) is formed by surface-treating an ITO-deposited glass substrate with UV-ozone for 15 minutes, spin-coating a PEDOT:PSS solution (H.C. Starks) thereon, and heat-treating it under an air atmosphere at 150° C. for 10 minutes and then, under a $N_2$ atmosphere at 150° C. for 10 minutes. Subsequently, on the hole injection layer (HIL), a poly[(9,9-dioctylfluorenyl-2,7-diyl-co-(4,4'-(N-4-butylphenyl)diphenylamine] solution (TFB) (Sumitomo Corp.) is spin-coated at 150° C. for 30 minutes to form a hole transport layer (HTL).

On the hole transport layer (HTL), a first emission layer is formed in the same method as the method of forming the blue emission layer 1-6, a second emission layer is formed thereon in the same method as the method of forming the blue emission layer 1-5, and a third emission layer is formed thereon in the same method as the method of forming the blue emission layer 1-4.

A solution of the ZnMgO nanoparticles according to Synthesis Example 2 (solvent: ethanol, optical density: 0.5 a.u) is prepared. The prepared solution is spin-coated on the third emission layer and heat-treated at 80° C. for 30 minutes to form an electron auxiliary layer. Aluminum (Al) is vacuum-deposited on a portion of the surface of the electron auxiliary layer to form a second electrode and accordingly, to produce a light emitting device as shown in FIG. 1.

Example 2

A light emitting device is produced according to the same method as Example 1 except that a first emission layer is formed on the hole transport layer (HTL) in the same method as the method of forming the blue emission layer 1-6, a second emission layer is formed thereon in the same method as the method of forming the emission layer 1-3, and a third emission layer is formed thereon in the same method as the method of forming the emission layer 1-4.

Example 3

A light emitting device is produced according to the same method as Example 1 except that a first emission layer is formed on the hole transport layer (HTL) in the same method as the method of forming the red emission layer 2-6, a second emission layer is formed on the first emission layer in the same method as the method of forming the emission layer 2-5, and a third emission layer is formed on the second emission layer in the same method as the method of forming the emission layer 2-4.

Example 4

A light emitting device is produced according to the same method as Example 1 except that a first emission layer is formed on the hole transport layer (HTL) in the same method as the method of forming the red emission layer 2-6, a second emission layer is formed on the first emission layer in the same method as the method of forming the emission layer 2-3, and a third emission layer is formed on the second emission layer in the same method as the method of forming the emission layer 2-4.

Comparative Example 1

An electroluminescent device (ITO/PEDOT:PSS (30 nm)/TFB (25 nm)/emission layer (40 nm)/ZnMgO (20 nm)/Al (100 nm)) is produced according to the same method as Example 1 except that a single emission layer is formed in the same method as the method of forming the blue emission layer 1-5.

Reference Example 1

An electroluminescent device (ITO/PEDOT:PSS (30 nm)/TFB (25 nm)/first emission layer (30 nm)/second emission layer (30 nm)/ZnMgO (20 nm)/Al (100 nm)) is produced according to the same method as Example 1 except that a first emission layer is formed in the same method as the method of forming the blue emission layer 1-5, and a second emission layer is formed thereon in the same method as the method of forming the emission layer 1-1 to form a bilayered emission layer.

Electroluminescence properties of the light emitting devices according to Example 1, Comparative Example 1, and Reference Example 1 are measured by using a Keithley 2200 source-measuring equipment and a Minolta CS2000 spectroradiometer (a current-voltage-luminance-measuring equipment). A current depending on a voltage applied to the devices, luminance, and electroluminescence (EL) are measured by using the current-voltage-luminance-measuring equipment, and external quantum efficiency is determined for each device. The results are shown in Table 3.

Figure 4:
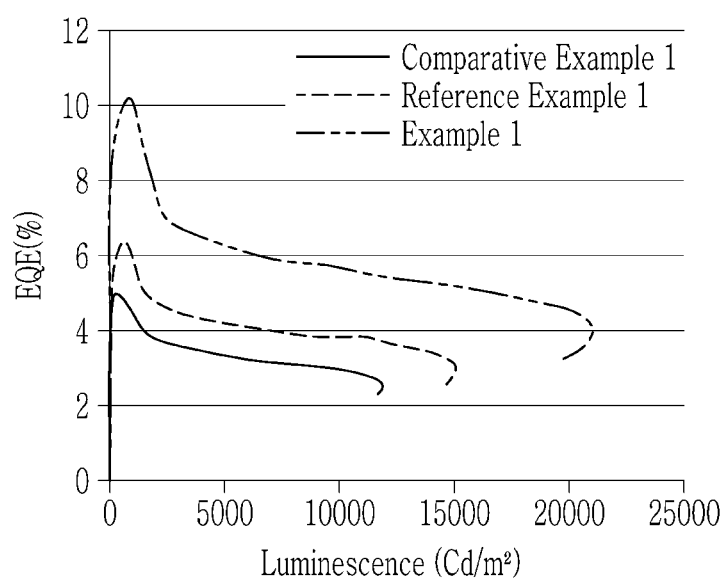
FIG. 4 is a graph showing the electroluminescence properties (EQE vs. Luminance) of the light emitting devices produced in Comparative Example 1, Reference Example 1, and Example 1.
Figure 5:
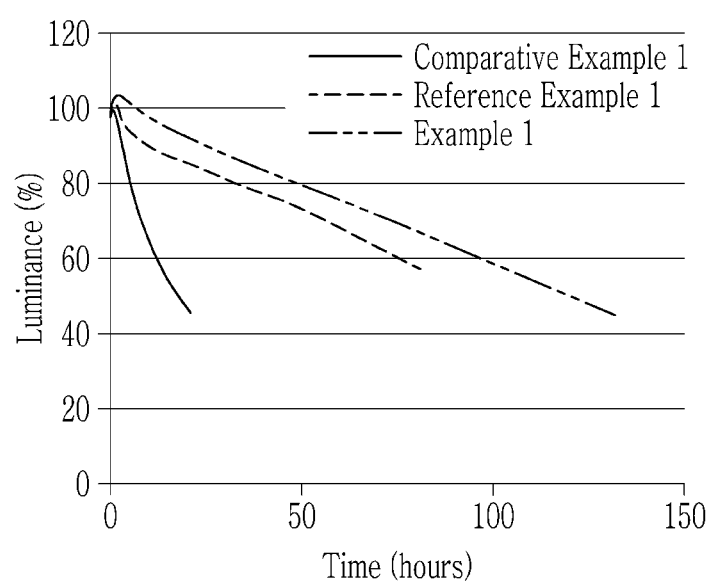
FIG. 5 is a graph showing the electroluminescence properties (Luminance vs. hours) of the light emitting devices produced in Comparative Example 1, Reference Example 1, and Example 1.

A plot of EQE vs. luminance property, and a plot of luminance vs. hours property are shown in FIGS. 4 and 5, respectively. FIG. 4 is a graph showing the electroluminescence properties (EQE vs. luminance) of the light emitting devices produced in Comparative Example 1, Reference Example 1, and Example 1. FIG. 5 is a graph showing the electroluminescence properties (luminance vs. hours) of the light emitting devices produced in Comparative Example 1, Reference Example 1, and Example 1.

TABLE 3

| | Max. EQE | EQE @ 1000 nit | Max. cd/A | V @5 mA/cm² | cd/m² @5 mA/cm² | Lambda max. (nm) | FWHM (nm) | Max Lum. | T95(hr) @ 325 nit |
|---|---|---|---|---|---|---|---|---|---|
| Comp. Ex. 1 | 5.0 | 4.5 | 4.4 | 3.9 | 213 | 458 | 32 | 11840 | 1.84 |
| Ref. Ex. 1 | 6.4 | 5.9 | 4.3 | 3.6 | 199 | 454 | 24 | 15090 | 3.92 |
| Ex. 1 | 10.1 | 10.0 | 6.2 | 3.4 | 301 | 454 | 22 | 21060 | 13.21 |

\* EQE max: maximum external quantum efficiency
\* EQE@ 1000 nit: external quantum efficiency at luminance of 1000 nit
\* Max cd/A: maximum current efficiency
\* $\lambda_{max}$: maximum light emitting wavelength
\* Max Lum.: maximum luminance (cd/m²)

Referring to Table 3 and FIGS. 4 and 5, the device of Example 1 exhibits improved efficiency, luminance, and life-span characteristics and a reduced driving voltage compared with the devices of Comparative Example 1 and Reference Example 1.

While this disclosure has been described in connection with what is presently considered to be practical example embodiments, it is to be understood that the invention is not limited to the disclosed embodiments, but, on the contrary, is intended to cover various modifications and equivalent arrangements included within the spirit and scope of the appended claims.

DESCRIPTION OF SYMBOLS

10: light emitting device
11: first electrode
12: first charge auxiliary layer
13: emission layer
14: second charge auxiliary layer
15: second electrode

What is claimed is:
1. A light emitting device, comprising
   a first electrode and a second electrode facing each other, and an emission layer disposed between the first electrode and the second electrode, and comprising quantum dots,
   a first charge auxiliary layer disposed between the emission layer and the first electrode, and a second charge auxiliary layer disposed between the emission layer and the second electrode,
   wherein the emission layer comprises a plurality of layers comprising quantum dots, and
   the quantum dots comprise an organic ligand on a surface, and a content of the organic ligand of the quantum dots increases sequentially from a first layer in contact with the first charge auxiliary layer to a second layer in contact with the second charge auxiliary layer.

2. The light emitting device of claim 1, wherein the emission layer comprises a first layer, a third layer, and a second layer which are continuously disposed, and a content of the organic ligand of the quantum dots of the first layer is less than a content of the organic ligand of the quantum dots of the second layer.

3. The light emitting device of claim 1, wherein a content of the organic ligand of the quantum dots of the first layer is less than or equal to about 70 parts by weight based on 100 parts by weight of the organic ligand of the quantum dots of the second layer.

4. The light emitting device of claim 1, wherein a content of the organic ligand of the quantum dots of the first layer is less than or equal to about 60 parts by weight based on 100 parts by weight of the organic ligand of the quantum dots of the second layer.

5. The light emitting device of claim 1, wherein the quantum dots of the first layer comprise an organic ligand in an amount of less than or equal to about 10 weight percent based on a total weight, 100 weight percent of the quantum dots of the first layer.

6. The light emitting device of claim 2, wherein the organic ligand comprises RCOOH, $RNH_2$, $R_2NH$, $R_3N$, RSH, $R_3PO$, $R_3P$, ROH, RCOOR, $RPO(OH)_2$, RHPOOH, $R_2POOH$, or a combination thereof, wherein R is independently a C3 to C40 substituted or unsubstituted aliphatic hydrocarbon group, a C6 to C40 substituted or unsubstituted aromatic hydrocarbon group, or a combination thereof.

7. The light emitting device of claim 1, wherein the quantum dots of the emission layer further comprise a halogen as a ligand and a content of the halogen of the quantum dots of the first layer is greater than a content of the halogen of the quantum dots of the second layer.

8. The light emitting device of claim 1, wherein the quantum dots of the emission layer further comprise a halogen as a ligand and a content of the halogen content of the quantum dots of the emission layer decreases sequentially from the first layer to the second layer.

9. The light emitting device of claim 1, wherein the quantum dots of the first layer further comprises a halogen as a ligand and quantum dots of at least one upper layer disposed on the first layer do not comprise a halogen.

10. The light emitting device of claim 7, wherein the halogen comprises fluorine, chlorine, bromine, iodine, or a combination thereof.

11. The light emitting device of claim 1, wherein the first layer further comprises a halogen as a ligand and comprises a halogen ligand in an amount of less than or equal to about 50 weight percent based on a total amount, 100 wt % of the organic ligand and the halogen ligand of the first layer.

12. The light emitting device of claim 1, wherein the plurality of layers of the emission layer are configured to emit light of the same color or a different color.

13. The light emitting device of claim 1, wherein the second charge auxiliary layer comprises a metal oxide.

14. The light emitting device of claim 13, wherein the metal oxide comprises a zinc metal oxide represented by Chemical Formula 1:

$$Zn_{1-x}M_xO \quad \text{Chemical Formula 1}$$

wherein, in Chemical Formula 1,
M is Mg, Ca, Zr, W, Li, Ti, Y, Al, or a combination thereof, and
$0 \leq x \leq 0.5$.

15. The light emitting device of claim 1, wherein the respective thickness of the plurality of layers of the emission layer are the same or different, and are about 1 nanometer to about 100 nanometers.

16. The light emitting device of claim 1, wherein a HOMO energy level of the first charge auxiliary layer in contact with the first layer is equal to or less than a HOMO energy level of the first layer though within about 1.0 eV or less.

17. The light emitting device of claim 1, wherein a HOMO energy level of the upper layer in contact with the first layer is the same as or less than a HOMO energy level of the first emission layer though within about 1.0 eV or less.

18. The light emitting device of claim 1, wherein the HOMO energy levels of the plurality of layers of the emission layer are in similar ranges, and a difference between HOMO energy levels of two respective adjacent layers of the plurality of layers is in the range of about 0 eV to about 1.0 eV.

19. A method of producing the light emitting device of claim 1, comprising
forming a first charge auxiliary layer on the first electrode,
forming an emission layer comprising a plurality of layers on the first charge auxiliary layer;
forming a second charge auxiliary layer on the emission layer; and
forming a second electrode on the second charge auxiliary layer,
wherein the forming of the emission layer comprises:
forming a quantum dot coating film comprising a plurality of quantum dots having organic ligand present on the surface and removing at least a portion of the organic ligand from the surface of the quantum dots of the quantum dot coating film, and
repeatedly performing the process to form a plurality of layers,
wherein a content of the organic ligand of the quantum dots increases sequentially from a first layer in contact with the first charge auxiliary layer to a second layer in contact with the second charge auxiliary layer.

20. The method of claim 19, wherein the first layer is produced by a method comprising
preparing an alcohol solution of a metal halide;
contacting each of the quantum dot coating films with the alcohol solution; and
removing the alcohol solution from the quantum dot coating films, and drying the quantum dot coating films.

21. The method of claim 20, wherein the metal halide comprises zinc.

22. The method of claim 21, wherein the metal halide comprises a fluoride, a chloride, a bromide, an iodide, or a combination thereof.

23. The method of claim 19, wherein a content of the organic ligand of the first layer is less than or equal to about 70 parts by weight based on 100 parts by weight of the organic ligands of the second layer.

24. A display device comprising the light emitting device of claim 1.

* * * * *